United States Patent
Ewert et al.

(10) Patent No.: US 7,703,950 B2
(45) Date of Patent: Apr. 27, 2010

(54) SIDE-EMITTING LENS FOR LED LAMP

(75) Inventors: Jurgen E. Ewert, Woodstock, VT (US);
Robert L. Seidler, Jr., Etna, NH (US)

(73) Assignee: C-R Control Systems, Inc., West Lebanon, NH (US)

( * ) Notice: Subject to any disclaimer, the term of this patent is extended or adjusted under 35 U.S.C. 154(b) by 237 days.

(21) Appl. No.: 11/943,743

(22) Filed: Nov. 21, 2007

(65) Prior Publication Data

US 2009/0129097 A1   May 21, 2009

(51) Int. Cl.
*F21V 5/02* (2006.01)
(52) U.S. Cl. .................. 362/339; 362/336; 362/311.02
(58) Field of Classification Search .................. 362/327, 362/310, 326, 336, 337, 338, 339, 311.02, 362/555, 800
See application file for complete search history.

(56) References Cited

U.S. PATENT DOCUMENTS

| | | | |
|---|---|---|---|
| 1,495,521 A | 5/1924 | Kopp | |
| 1,945,190 A | 1/1934 | Handlan | |
| 3,739,169 A | 6/1973 | Weinreich | |
| 5,230,560 A | 7/1993 | Lyons | |
| 5,335,157 A | 8/1994 | Lyons | |
| 5,897,201 A | 4/1999 | Simon | |
| 6,099,148 A | 8/2000 | Northrup et al. | |
| 6,590,235 B2 * | 7/2003 | Carey et al. | 257/98 |
| 6,598,998 B2 | 7/2003 | West et al. | |
| 6,607,286 B2 | 8/2003 | West et al. | |
| 6,679,621 B2 | 1/2004 | West et al. | |
| 6,755,556 B2 * | 6/2004 | Gasquet et al. | 362/329 |
| 6,951,415 B2 * | 10/2005 | Amano et al. | 362/520 |
| 7,006,306 B2 | 2/2006 | Falicoff et al. | |
| 7,021,797 B2 | 4/2006 | Minano et al. | |
| 7,153,002 B2 | 12/2006 | Kim et al. | |

* cited by examiner

*Primary Examiner*—Gunyoung T Lee
(74) *Attorney, Agent, or Firm*—Michael J. Weins; Jeffrey E. Semprebon

(57) ABSTRACT

A side-emitting lens for use with an LED lamp provides a distribution of emitted light that is substantially normal to an axis of symmetry of the lens; the light can also be symmetrical with respect to a plane normal to the lens axis. The lens has a cavity in which the LED lamp can reside, having a cavity refracting surface with a central section and a stepped cavity sidewall. The lens also has a base external refracting surface surrounding the cavity, an internal reflecting surface spaced apart from the cavity, and a side surface; these surfaces redirect light that enters the lens through the cavity refracting surface. For many applications, the lens axis is vertical in service and the lens is configured to provide a narrow distribution of light in the horizontal plane.

11 Claims, 5 Drawing Sheets

SIDE-EMITTING LENS FOR LED LAMP

FIELD OF THE INVENTION

The present invention relates to side-emitting lenses that redirect the light emitted by a source such as an LED lamp to provide a distribution of light that is substantially symmetrical about an axis and is substantially normal thereto, and more particularly relates to such a lens that is particularly well suited for use in luminaires for marine applications marking buoys and similar objects.

BACKGROUND OF THE INVENTION

Luminaires which provide a generally horizontal distribution of emitted light have long been employed for marking objects of navigational interest, such as buoys and fixed obstructions. The horizontal distribution of light increases the efficiency of such luminaires, as it causes the light generated to be concentrated in the generally horizontal region where viewers are most likely to be located. This desired horizontal distribution has classically been attained by using cylindrical Fresnel lenses surrounding a centrally-located lamp, such as taught in U.S. Pat. No. 6,099,148. While such lenses can concentrate a large portion of light emitted from a lamp into a substantially horizontal distribution, those portions of the light which are directed substantially vertically upward or downward will not enter such lenses, and thus are wasted. To avoid the loss of these substantially vertically-directed portions of the light, U.S. Pat. Nos. 5,230,560 and 5,335,157 teach the use of reflectors to redirect these portions of the light in a substantially horizontal direction in order to provide greater efficiency for the luminaire.

More recently, there has been a need to redirect light from LED's so as to provide a distribution of light suitable for illuminating a backlit display. U.S. Pat. Nos. 6,598,998; 6,607,286; and 6,679,621 teach side-emitting lenses that redirect the light emitted by LED's to obtain a distribution of light in a direction substantially perpendicular to an axis of symmetry of the lens; this distribution is intended to increase efficiency by directing most of the light generated into a thin backlighting panel light guide, into which the lens is inserted, and minimizing the portion of light not directed into the panel. These lenses employ an internal reflecting surface which is generally conical in overall shape, and which functions to reflect light from the LED to an associated refracting surface, which in turn refracts the light to exit the lens in a substantially perpendicular direction, so as to enter the backlighting panel. This refracting surface can be a sawtooth surface, somewhat resembling a portion of a cylindrical Fresnel lens, or can be formed by a simple frustoconical surface which forms an oblique angle to the axis of symmetry of the lens. The lens has a cavity in which the LED is located, with the reflecting surface located above the cavity. In some embodiments, the lens has a second refracting surface, which forms a smooth convex curve designed to further refract the light so as to direct it into the backlighting panel.

U.S. Pat. No. 7,153,002 states that the side-emitting lenses for LED's taught in the '998, '286, and '621 patents are limited by the size of LED light source which can be accommodated, as some light is not directed out the sides when larger LED light sources are employed. The '002 patent teaches a lens structure which is stated to be more suitable for use with larger LED light sources, such as those where multiple LED's are employed to provide greater light intensity or where the white light is formed by combining the light from three primary-color LED's. In the '002 lens structure, the lens has both an upper reflecting surface and an inner reflecting surface, these reflecting surfaces serving to direct the light to be emitted through side surfaces.

Since luminaires for marking obstructions are frequently employed at remote locations, such as on buoys, it is desirable for such luminaires to employ LED's to generate light. LED's provide advantages of reliability and relatively low power consumption, reducing the size of batteries needed for power. While the side-emitting lenses discussed above apparently serve well for backlighting applications, they have not been found practical for use in a luminaire for marking obstructions. Such lenses are designed only to assure that the light emitted through the side surfaces will enter a light guide of a backlighting panel, and this distribution of light has not been found to be sufficiently well-directed to be practical in providing the needed intensity of light for a marker luminaire without undue power consumption.

SUMMARY OF THE INVENTION

The present invention is for a side-emitting lens for use with an LED lamp. The lens of the present invention is well suited for fabrication by molding, and can provide a very high degree of uniformity in the radial distribution of the emitted light.

The lens is symmetrically disposed about a central lens axis, and serves to redirect light generated by the LED lamp so that the light will be emitted radially and substantially normal to the central lens axis so as to have a very limited angle of divergence when the lens is in service. For many applications, such as for use marking objects in a marine environment where the central lens axis will be vertical in service, it is preferred for the divergence be controlled such that distribution of light emitted above the horizontal plane is substantially a mirror image of the distribution of light below the horizontal plane.

The lens has a base section having a cavity which is symmetrically disposed about the lens axis. The cavity is bounded by surfaces that receive substantially all the light generated by the LED lamp. The LED devices employed for providing the LED lamp typically do not provide a point source for generating light, but do generate light distributed about a centering point CP. The lens is configured to direct light emitted from the centering point CP such that, when the LED lamp and the lens are positioned such that the centering point CP is located on the central lens axis, the light is emitted in a direction substantially normal to the lens axis. For most applications, the centering point CP resides within the cavity, however if the centering point CP is located outside the cavity, then the LED lamp should be designed to provide a limited angle of generated light to assure that substantially all the light is directed into the cavity.

The cavity is, in part, bounded by a cavity refracting surface having a central section that is substantially normal to the central lens axis. The term "substantially normal", as used in describing the present invention shall be construed as either a surface extending in a plane that is normal to the central lens axis or a slightly curved surface where the entire surface resides in close proximity to a plane that is normal to the central lens axis; in this latter case, the central section can be formed by either a continuous curve or a faceted curve made up of frustoconical segments, however it is preferred that the central section be formed by a surface that is planar. The remainder of the cavity refracting surface is formed by a stepped cavity sidewall, with the steps being formed by surfaces of rotation about the central lens axis. The stepped sidewall attaches to the central section so as to provide an expanding cavity as the distance from the center section increases.

In one preferred configuration of the stepped cavity sidewall, it is formed by a series of rings, which form the steps of the stepped surface, with the risers that connect the steps being formed by rings or bands that are either parallel to or substantially parallel to the lens axis. To reduce the portion of light not directed into the emitted horizontal band, the rings that form the steps are preferably sloped surfaces so as to each form part of a cone, where each of these cones has an apex at the centering point CP.

The base section of the lens also has a base external refracting surface which is generated by rotation of a lower surface generating element about the central lens axis. The base external refracting surface surrounds and is spaced apart from the cavity refracting surface. The base external refracting surface expands as the distance from the central section of the cavity refracting surface increases.

The lens has an internal reflecting surface spaced apart from the cavity and symmetrically disposed about the lens central axis. The internal refracting surface terminates in a vertex and a rim. A side surface attaches to the rim and provides a surface that is substantially parallel to the lens central axis and joins the base external refracting surface. The side surface serves as a refracting surface for light impinging on it after being reflected by the internal reflecting surface. While the side surface could be made parallel to the central axis, it should be provided with a slight draft angle when the lens is to be fabricated by molding.

The base section of the lens is preferably provided with a flange which attaches to the base external refracting surface and extends therebeyond. The flange provides a convenient structure for mounting the lens into a lighting assembly, and is typically provided with a number of fastener passages for receiving fasteners used to secure the lens to the remainder of the lighting assembly, to which the LED lamp is also mounted. The flange has a central opening that communicates with the cavity, and a mounting surface.

BRIEF DESCRIPTION OF THE DRAWINGS

FIG. 4 also shows a two-part mold that can be employed to fabricate the lens without creating seams on the surfaces which direct the light.

DETAILED DESCRIPTION OF THE PREFERRED EMBODIMENTS

Figure 1:
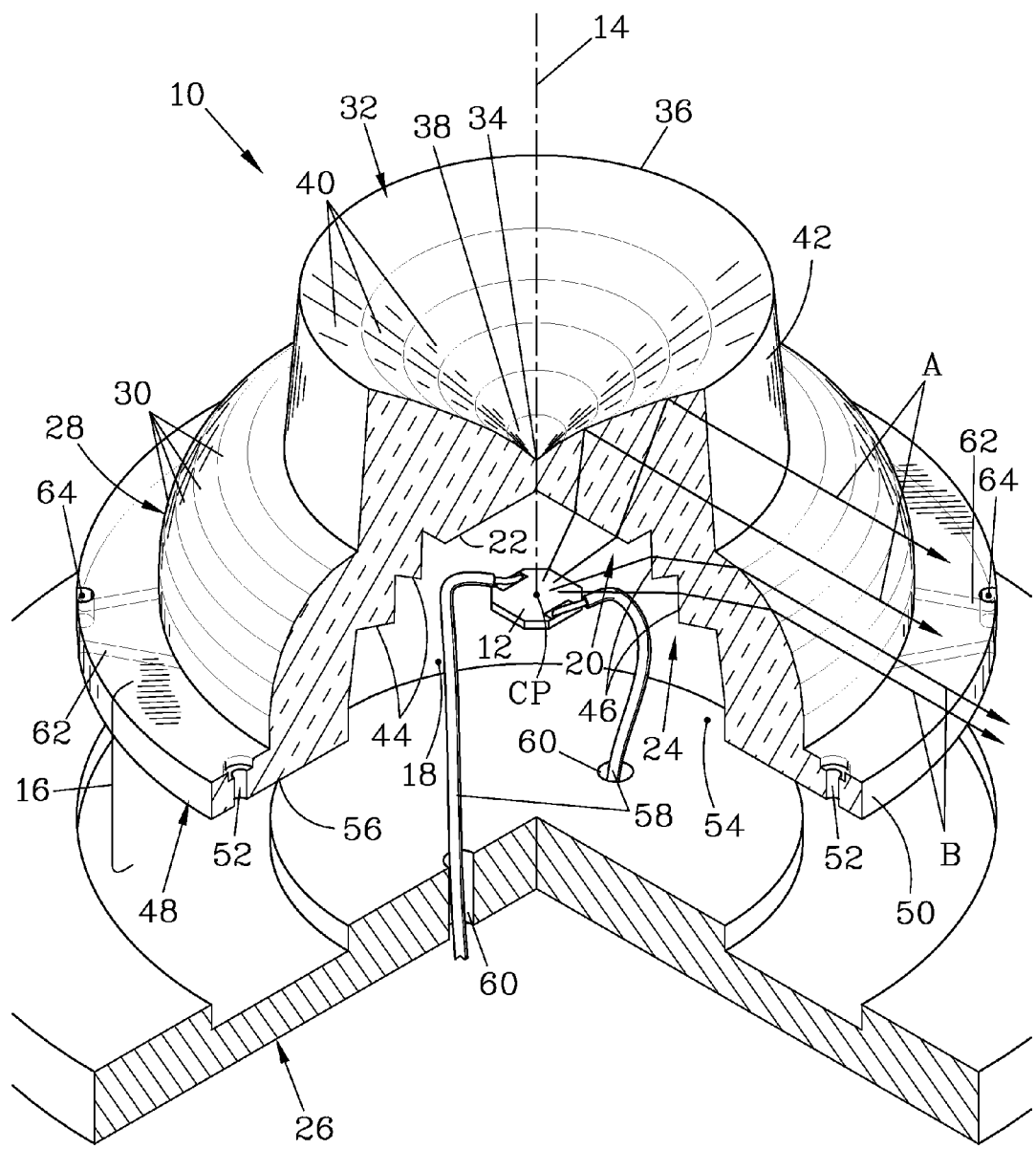
FIG. 1 is a partially sectioned isometric view of a lens that forms one embodiment of the present invention, illustrating how the surfaces of the lens direct rays of light generated by an LED lamp residing in a cavity of the lens and located at a centering point. This embodiment employs a faceted internal reflecting surface as well as a faceted base external refraction surface. As shown, electrical leads to power the LED lamp pass through a substrate on which both the LED lamp and the lens are mounted.
Figure 2:
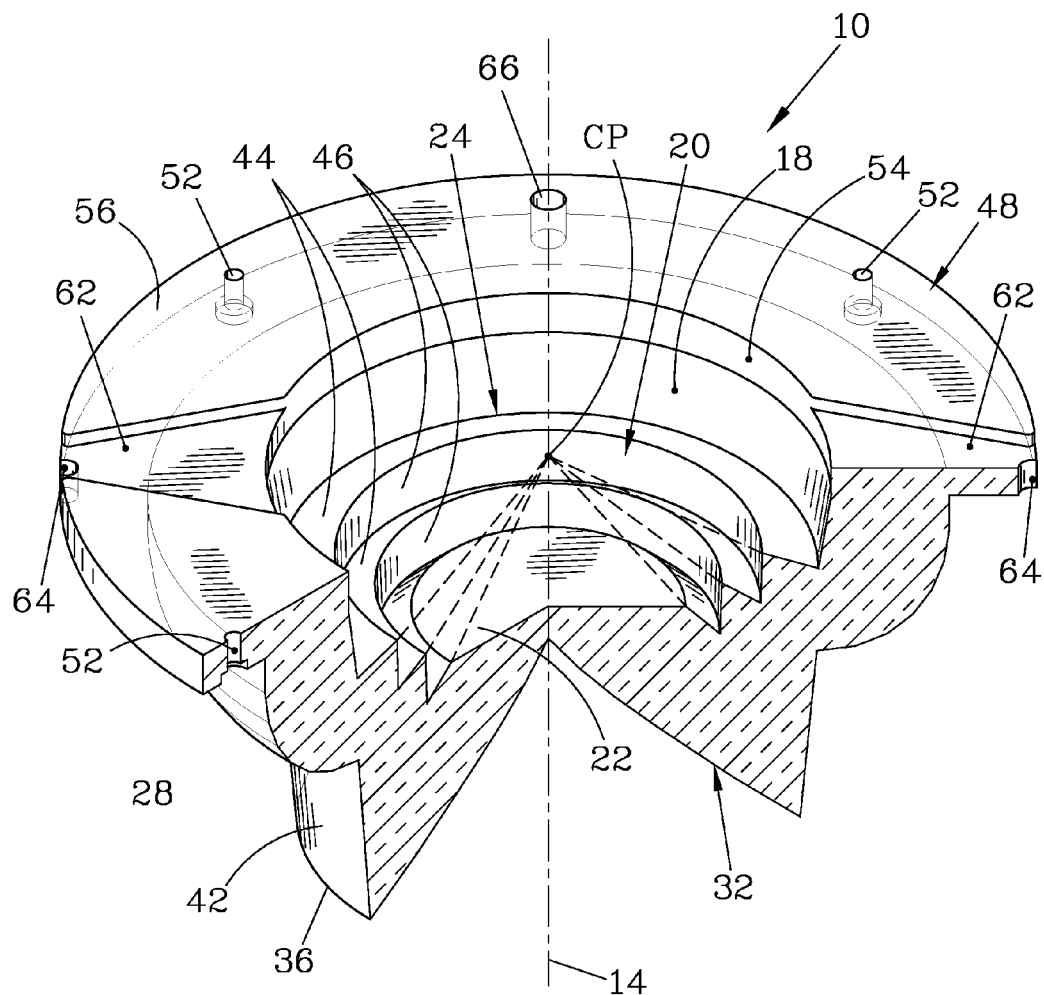
FIG. 2 is a partially sectioned isometric view of the lens shown in FIG. 1, when viewed from a different angle from FIG. 1 to better show the cavity, without the LED lamp or its wiring being present.
Figure 3:
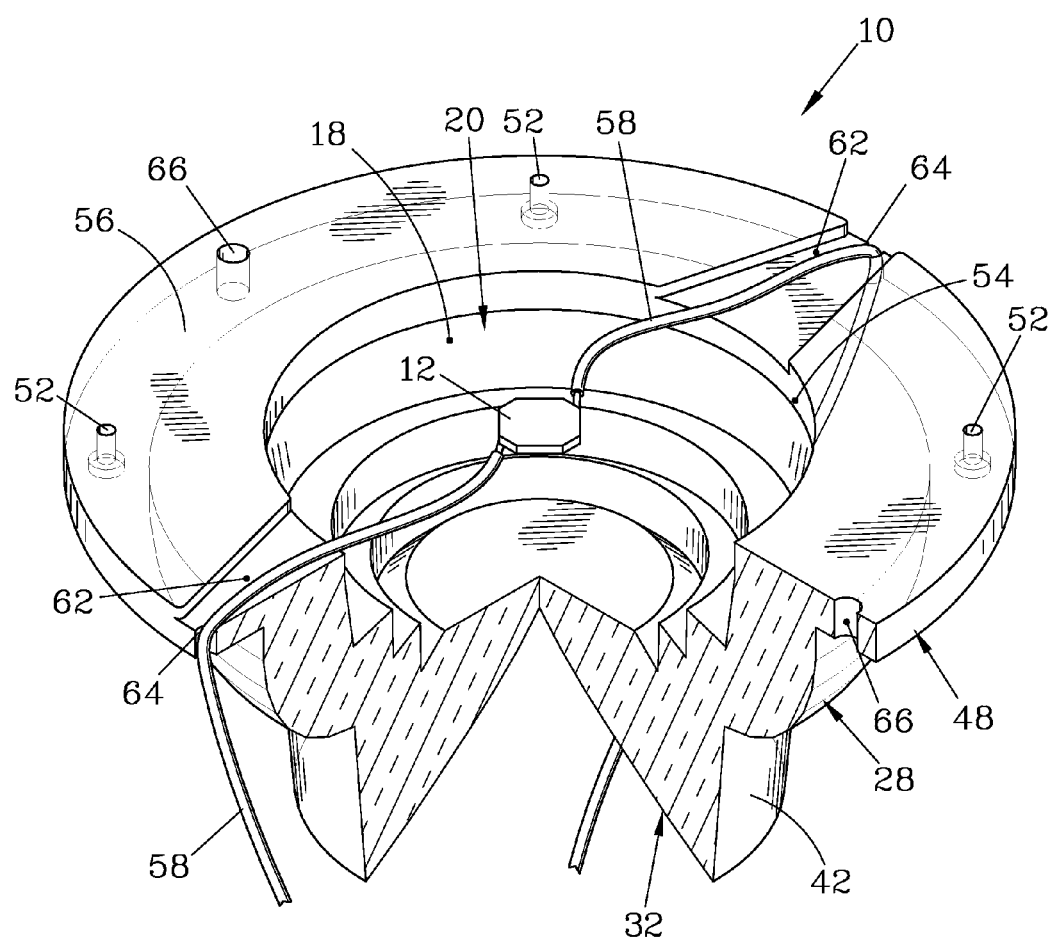
FIG. 3 is another partially sectioned view of the lens shown in FIGS. 1 and 2, better illustrating the function of channels provided in a flange of the lens; these channels facilitate the connection of electrical leads to the LED lamp when the lens is to be attached to a substrate which provides no passages for the electrical leads.

FIGS. 1-3 illustrate one embodiment of the present invention, a side-emitting lens 10 which serves to redirect light generated by an LED lamp 12. The lens 10 is symmetrically disposed about a central lens axis 14, and the lens 10 redirects the light from the LED lamp 12 in such a manner as to provide a distribution of emitted light which is substantially normal to the lens axis 14. Frequently, when the lens 10 is in service, it is oriented as illustrated with the central lens axis 14 substantially vertical; in such cases, the lens 10 will provide a distribution of emitted light which is substantially horizontal, making it well suited for use in marker luminaires used to mark buoys, fixed obstructions, and other objects of navigational importance.

The lens 10 has base section 16 which has a cavity 18 therein, which is symmetrically disposed about the central lens axis 14. The cavity 18 in turn is bounded by a cavity refracting surface 20 having a central section 22 that is substantially planar and a stepped cavity sidewall 24. In this embodiment, the central section 22 is a planar surface that is normal to the central lens axis 14. The stepped sidewall 24 is formed by surfaces of rotation about the central lens axis 14, and attaches to the central section 22 so as to provide an expanding cross section of the cavity 18 as the distance increases from the central section 22.

The central section 22 and the stepped cavity sidewall 24 receive substantially all the light generated by the LED lamp 12. While the LED lamp 12 will typically not provide a point source of light, such LED devices typically generate a distribution of light that is centered about a centering point CP. The lens 10 and the LED lamp 12 are mounted onto a substrate 26 in such a manner that the centering point CP is located on the central lens axis 14 when the LED lamp 12 is in service; for many applications, the substrate 26 will be part of a luminaire structure and will be designed to index the LED lamp 12 and the lens 10 to align the centering point CP with the central lens axis 14.

The lens 10 also has a base external refracting surface 28 which is spaced apart from and surrounds the cavity 18. In this embodiment, the base refracting surface 28 is formed by a series of facets 30 that are formed as a series of frustoconical segments symmetrically disposed about the central lens axis 14. The stepped sidewall 24 and the external refracting surface 28 provide a cross-section of the lens 10 with a reduced wall thickness. This reduced relative wall thickness makes the lens 10 more suitable to fabrication by molding or casting.

The lens 10 also has an internal reflecting surface 32 which is spaced apart from the cavity 18 and is generally conical in overall shape. The internal reflecting surface 32 is symmetric about the central axis 14 and terminates at a vertex 34 and a rim 36. In this embodiment, the internal reflecting surface 32 is a faceted surface formed by a conical surface 38, extending upward from the vertex 34, and a series of frustoconical surfaces 40. A side surface 42 that is substantially parallel to the central lens axis 14 attaches to the rim 36 and connects to the base external refracting surface 28. In this embodiment, while the side surface 42 is substantially parallel to the central axis 14, a draft angle is provided such that the side surface 42 becomes smaller in diameter as it approaches the rim 36. This draft angle is typically about 1-3° to facilitate fabrication of the lens 10 by molding, as discussed in greater detail with regard to the embodiment shown in FIG. 4.

The cavity refracting surface 20 of the lens 10 acts to direct light emitted by the LED lamp 12 and entering the cavity refracting surface 20 in such a manner as to distribute the majority of the light either to the internal reflecting surface 32 or to the base external refracting surface 28. The majority of the light that enters the lens 10 through the central section 22, as indicated in FIG. 1 by the arrows A, is directed to the internal reflecting surface 32. The internal reflecting surface 32 is configured to reflect this portion of the light such that it will be directed substantially normal to the central lens axis 14 when it exits from the side surface 42. Since the central section 22 of this embodiment is planar, the light intersecting the internal reflecting surface 32 will arrive at different angles. In this embodiment, the internal reflecting surface 32 is provided by a faceted surface, such that the angle of the internal reflecting surface 32 with respect to the central lens axis 14 varies with its distance from the cavity 18 in order to compensate for the light arriving at different angles. As noted above, in the lens 10 the internal reflecting surface 32 is faceted, being constructed from the conical surface 38 and the series of frustoconical surfaces 40. The use of a series of facet surfaces (38, 40) rather than a continuously curved surface facilitates design of the internal reflecting surface 32 by computer modeling so as to provide the desired distribution of emitted light.

The stepped cavity sidewall 24 of the cavity 18 has steps formed by a series of frustoconical ring surfaces 44 that alternate with a series of sidewall refracting surfaces 46. In the lens 10, the frustoconical ring surfaces 44 are angled so as to each form part of a relatively shallow cone having a vertex at the centering point CP, as shown in FIG. 2. This configuration of the frustoconical ring surfaces 44 serves to reduce the relative area of each frustoconical ring surface 44 as seen by light radiating outward from the centering point CP, since the frustoconical ring surfaces 44 are substantially aligned with the rays from the LED lamp 12, and thus only present thin edges to such light. This configuration of the frustoconical ring surfaces 44 should minimize the amount of light from the LED lamp 12 that enters the lens 10 through the frustoconical ring surfaces 44, since the LED lamp 12 typically generates a distribution of light about the centering point CP.

The majority of the light that enters the lens 10 through the sidewall refracting surfaces 46, indicated in FIG. 1 by the arrows B, is directed to the base external refracting surface 28. The sidewall refracting surfaces 46 and the base external refracting surface 28 are configured to refract this portion of the light such that it will be directed substantially normal to the central lens axis 14 when it exits the base external refracting surface 28. For many applications, it is preferred for the cavity refracting surface 20, the base external refracting surface 28, the internal reflecting surface 32, and the side surface 42 to be configured such that the distribution of emitted light is symmetrical with respect to a plane that is normal to the central lens axis 14, with an equal distribution of light on either side of this plane. In situations where the central lens axis 14 is vertical in service, this results in a vertically symmetrical distribution of the emitted light, with the distribution of light above the horizontal plane being a mirror image of the distribution of light below the horizontal plane. The use of the planar central section 22, the segmented base external refracting surface 28, and the segmented internal reflecting surface 32 provide the lens 10 with a structure that is readily modeled to facilitate the adjustment of the resulting light output by relatively simple computer modeling of the lens 10.

Preferably, the sidewall refracting surfaces 46 are provided with a minimal draft angle to enhance moldability, having a slight draft angle of about 1-3° with respect to the central lens axis 14.

To provide for mounting the lens 10 onto the substrate 26, which could be an element of a luminaire structure, the base section 16 of the lens 10 has a flange 48 which attaches to the base external refracting surface 28 and extends therebeyond. The flange 48 terminates at a rim 50 and has a number of fastener passages 52 therethrough for receiving fasteners used to secure the lens 10 to the substrate 26, to which the LED lamp 12 is also mounted. The flange 48 has a central opening 54 that communicates with and essentially extends the cavity 18, the central opening 54 terminating at a mounting surface 56 which mates with the substrate 26. As illustrated in FIG. 1, power can be provided to the LED lamp 12 by a pair of power leads 58 that pass through passages 60 in the substrate 26.

In some situations, the lens 10 will be mounted to a substrate which does not lend itself to providing passages therethrough that will allow power to be provided to a LED lamp positioned in a cavity of a lens. For such situations, the lens 10 is provided with channels 62 through which the leads 58 can be passed, as best shown in FIG. 3, which illustrates the use of these alternate paths for providing power to the LED lamp 12. One example of such is when the lens 10 is mounted on a substrate which serves as a cap of a luminaire. As illustrated in FIG. 3, power is provided in this situation by passing the power leads 58 through the channels 62 of the flange 48 so as to allow them to be connected to the LED lamp 12. These channels 62 are preferably flared or beveled so as to increase in cross section as they approach the central opening 54 to facilitate guiding the power leads therein during assembly of the luminaire. To further facilitate assembly, wire-retaining notches 64 are preferably provided in the flange 48, these wire-retaining notches 64 being positioned to intersect the channels 62. The wire-retaining notches 64 are each configured and sized such that one of the power leads 58 can be readily pressed into one of the wire-retaining notches 64 and thereafter will be frictionally retained therein when the power leads 58 are to be directed normal to the flange 48. When the power leads 58 are directed normal to the flange 48, they will pass through the light radiating from the lens 10 and can create shadows. This problem can be minimized by using paths for the power leads 58 that spiral past the lens 10.

The flange 48 as illustrated is also provided with a pair of power lead passages 66 therethrough (as shown in FIGS. 2 and 3), which allow access for additional wiring or power leads which may be desired in the luminaire.

Figure 4:
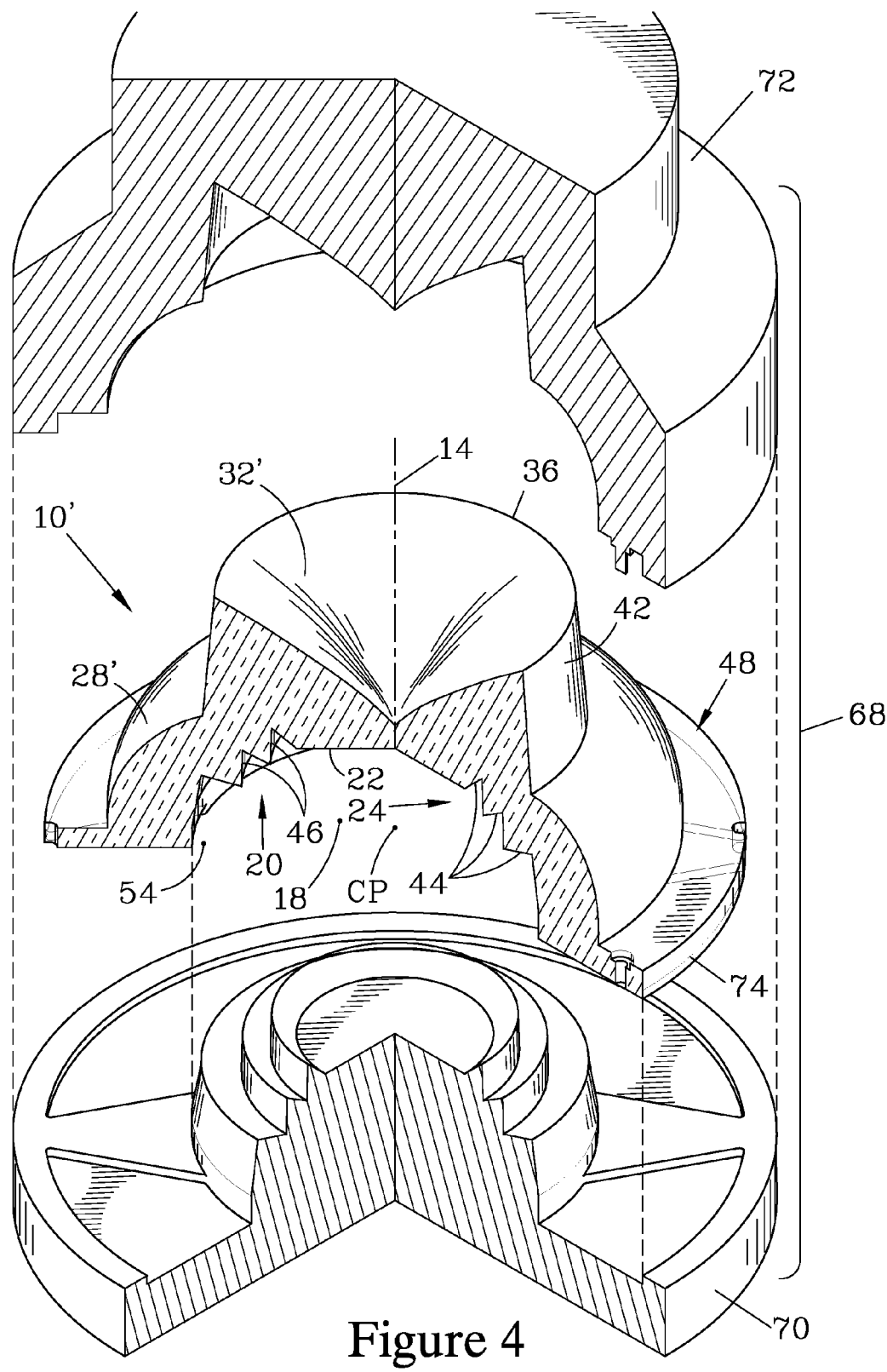
FIG. 4 is another partially sectioned isometric view of a lens that is similar to the lens illustrated in FIGS. 1-3, but where the internal reflecting surface and the base external refracting surface are formed as smooth curves and are not faceted.

FIG. 4 illustrates another embodiment of the present invention, a side emitting lens 10' which shares many of the features of the lens 10. The lens 10' is again designed for fabrication by molding. In this embodiment, the lens 10' has a base external refracting surface 28' which differs from the base external refracting surface 28 of the lens 10 in that it is a smoothly curved surface, rather than being faceted. Similarly, the lens 10' has an internal reflecting surface 32' that differs from the internal reflecting surface 32 in that it is smooth rather than faceted. These distinctions are of little importance to the moldability of the lens 10'.

As with the lens 10 discussed above, the lens 10' has the side surface 42 and sidewall refracting surfaces 46 that are each provided with a draft angle of 1-3° to facilitate fabrication of the lens 10' being molded. In the case of the sidewall refracting surfaces 46, which in part define the cavity 18, the draft angle is such that each of the sidewall refracting surfaces 46 diverges away from the central lens axis 14 as it extends away from the internal reflecting surface 32'. Similarly, the side surface 42 is provided with a draft angle; however, in this case the draft angle is such that the side surface 42 decreases in diameter as the rim 36 is approached. These draft angles allow the lens 10' to be fabricated in a two-part mold 68.

The mold 68 has a mold lower half 70 and a mold upper half 72, and the mold halves (70, 72) are configured such that a seam 74 between the mold halves (70, 72) resides in a plane that is normal to the central lens axis 14. The seam 74 between mold halves (70, 72) is preferably located at the edge where the base external refracting surface 28' joins the flange 48, or on the flange 48, in which case appropriate draft could also be provided for the central opening 54. This location for the seam 74 between the mold halves (70, 72) avoids having any seams on the external surfaces (24', 26', and 42') or on the cavity 18' of the lens 10', thereby avoiding seams on the surfaces which reflect or refract the light generated by the LED lamp (not shown in FIG. 4) in order to provide greater uniformity in the resulting distribution of light emitted from the lens 10'.

As pointed out above for the lens 10, the stepped sidewall 24 and the base external reflecting surface (28, 28') are configured to reduce the relative wall thickness of the lens (10, 10'). This configuration facilitates fabrication of the lens (10, 10') by molding, since it keeps the cross section of the lens (10, 10') between the cavity 18 and the base external reflecting surface (28, 28') relatively uniform and reduces the wall thickness, thereby lessening the problems resulting from shrinkage as the molded material cures and cools. Such shrinkage would cause distortions, as well as generating internal residual stresses which might adversely affect the optical properties of the lens. The reduced shrinkage and residual stresses should result in more even refraction throughout the lens (10, 10'), improving the angular uniformity of the emitted light.

Figure 5:
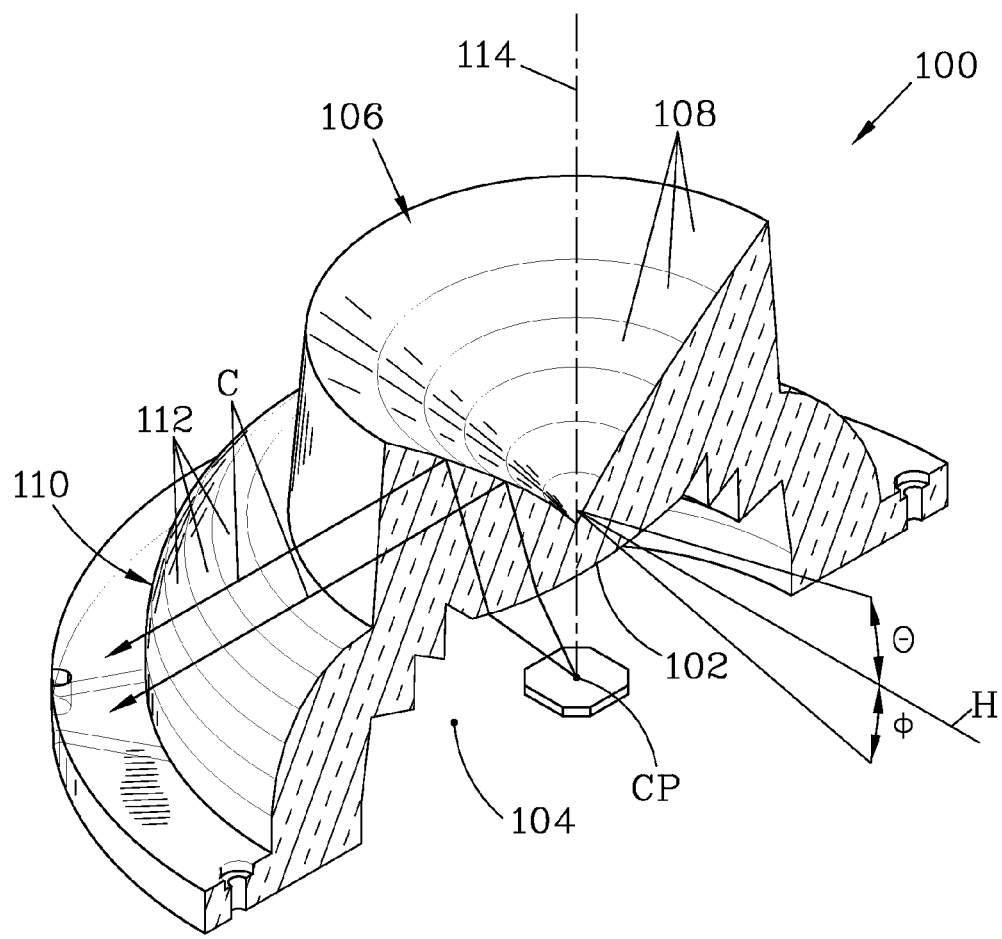
FIG. 5 is a sectioned isometric view of a lens which forms another embodiment of the present invention. In this embodiment, the cavity surface has a substantially planar central section which is slightly curved.

FIG. 5 is a sectioned isometric view of another embodiment of the present invention, a lens 100 which has an overall structure similar to that of the lens 10 discussed above. The lens 100 differs in the configuration of a substantially planar central section 102 that bounds a portion of a cavity 104, and in the corresponding configuration of an internal reflecting surface 106. The substantially planar central section 102 of this embodiment is slightly curved. In the lens 100, substantially planar central section 102 is convex. The central section 102 can be either a continuously curved surface or can be a faceted curved surface made up of segments.

Again, the internal reflecting surface 106 is formed by a series of conical and frustoconical segments 108. The lens 100 also has a base external refracting surface 110 which is faceted, being formed by a series of frustoconical segments 112. The use of surfaces (106, 110) made up from discrete frustoconical segments (108, 112), rather than continuous curves as employed in the lens 10' discussed above, simplifies modeling of the design of the lens 100, since these individual segments 112 can be readily adjusted in a computer model to provide the desired direction of emitted light. In fact, it is advantageous to have the curvature of the substantially planar central section 102 to be either truly planar or segmented for the purpose of simplifying computer modeling of the lens 100.

Computer modeling can be especially helpful in designing the lens 100 to provide a particular distribution of light with a specified distribution of the vertical divergence of the light with respect to the horizontal plane when the lens 100 is oriented with a lens central axis 114 extending vertically, as illustrated. The ability to model this divergence is important to avoid the problems that are frequently associated with side emitting lenses where typically a greater portion of the light is directed either below or, more typically when the lens is positioned above the LED, above the horizontal plane.

As schematically illustrated in FIG. 5, when the lens 100 is oriented with the central lens axis 114 extending vertically, the lens 100 has a distribution of light through an angle $\Theta$ above the horizontal plane H that is equal to the distribution of light through an equal angle $\Phi$ below the horizontal plane H.

In addition to the use of faceted surfaces to aid computer modeling, the relatively large size of the lens of the present invention facilitates adjustment of the design of the lens surfaces to provide a lens which will direct the emitted light in a desired narrow band of distribution. To provide very high efficiency in directing the emitted light in a narrow band, it is preferred for the central section of the lens to have a relatively large diameter compared to the size of the LED light source, such that a large percentage of the emitted light is directed to the internal reflecting surface. Using a lens having the design of the lens 10 with the faceted surfaces has allowed the fabrication of lenses based on modeling which, when employed in pairs, can provide a luminaire that readily meets the U.S. Coast Guard requirements of lights for fixed objects ($\pm 3°$ with an intensity of 60 candela or greater) as well as lights for buoys ($\pm 3.5°$ with an intensity of 60 candela or greater), while having sufficiently low power consumption to allow the luminaire incorporating these paired lenses to have batteries and solar panels within the requirements for size and weight for an LED self-contained lighting element.

While the novel features of the present invention have been described in terms of particular embodiments and preferred applications, it should be appreciated by one skilled in the art that substitution of materials and modification of details obviously can be made without departing from the spirit of the invention, which is to be limited only by the following claims.

What we claim is:

1. A side-emitting lens for a light-emitting diode (LED) lamp, the lens having a central lens axis about which the lens is symmetrically disposed, the lens serving to redirect light generated by the LED lamp which is initially directed along the central lens axis to a direction that is substantially perpendicular to the central lens axis, the lens comprising:
    a base section having,
        a cavity defined by a cavity refracting surface with a substantially planar central section, which is substantially normal to the central lens axis, and a stepped cavity sidewall having a series of sidewall refracting surfaces, and
        a base external refracting surface symmetrically disposed about the central lens axis and spaced apart from said stepped cavity sidewall;
    an internal reflecting surface that terminates in a rim and a vertex, said internal reflecting surface being spaced apart from said cavity and symmetrically disposed about the central lens axis; and
    a side surface attached to said rim and joining said base external refracting surface, said side surface being substantially parallel to the central lens axis.

2. The lens of claim 1 wherein said base section of the lens further comprises:
    a flange terminating at a rim, said flange attaching to and extending beyond said base external refracting surface, said flange having,
        a central opening that communicates with said cavity,
        a mounting surface, and an array of fastener passages extending through said flange.

3. The lens of claim 2 wherein said mounting surface of said flange is provided with channels, each of which traverses the width of said flange passing from said central opening to said rim, said channels converging as the distance from the central lens axis increases, said rim of said flange being provided with notches, each of which communicates with one of said channels, said channels in combination with their corresponding notches providing entry to said central opening and said cavity.

4. The lens of claim 1 wherein said sidewall refracting surfaces are symmetrically disposed about the central axis and substantially parallel to the central lens axis, and further wherein said stepped cavity sidewall further comprises:
a series of ring surfaces symmetrically disposed about the central lens axis and attaching to said sidewall refracting surfaces.

5. The lens of claim 4 wherein the LED lamp has centering point (CP) which, when in service with the lens, is located along the central axis of the lens, and further wherein each of said ring surfaces is a frustoconical surface that forms part of a cone, each of these cones having an apex at the centering point (CP).

6. The lens of claim 5 wherein said base section of the lens further comprises:
a flange terminating at a rim, said flange attaching to and extending beyond said base external refracting surface, said flange having,
a central opening that communicates with said cavity,
a mounting surface, and
an array of fastener passages extending through said flange.

7. The lens of claim 6 wherein said mounting surface of said flange is provided with channels, each of which traverses the width of said flange passing from said central opening to said rim, said channels converging as the distance from the central lens axis increases, said rim of said flange being provided with notches, each of which communicates with one of said channels, said channels in combination with their corresponding notches providing entry to said central opening and said cavity.

8. The lens of claim 4 wherein said side surface is inclined slightly with respect to the central lens axis by a draft angle such that the diameter of said side surface decreases as said side surface approaches said rim, and further wherein said sidewall refracting surfaces are each inclined slightly with respect to the central lens axis by a draft angle such that said sidewall refracting surfaces each diverge with respect to the central lens axis as said sidewall refracting surface increases in distance from said internal reflecting surface.

9. The lens of claim 5 wherein said central section of said cavity refracting surface, said internal reflecting surface, and said side surface are configured such that light generated by the LED lamp and entering said central section is predominantly directed to said internal reflecting surface and is reflected thereby so as to be substantially normal to the central lens axis when exiting from said side surface, and further wherein said sidewall refracting surfaces and said base external refracting surface are configured such that the light generated by the LED lamp and entering said sidewall refracting surfaces is predominantly directed to said base external refracting surface and is refracted thereby so as to exit therefrom substantially normal to the central lens axis.

10. The lens of claim 9 wherein said cavity refracting surface, said internal reflecting surface, said side surface, and said base external refracting surface are further configured such that the distribution of light emitted from the lens is symmetrical with respect to a plane normal to the central lens axis.

11. The lens of claim 8 wherein the draft angles of said side surface and said sidewall refracting surfaces with respect to the central axis each measure between about 1°-3°.

* * * * *